United States Patent [19]
Jeon et al.

[11] Patent Number: 5,969,364
[45] Date of Patent: Oct. 19, 1999

[54] WAFER FIXING UNIT FOR FOCUSED ION BEAM APPARATUS

[75] Inventors: Sang-young Jeon; Jong-chel Park, both of Yongin, Rep. of Korea

[73] Assignee: Samsung Electronics Co., Ltd., Suwon, Rep. of Korea

[21] Appl. No.: 09/020,511

[22] Filed: Feb. 9, 1998

[30] Foreign Application Priority Data

May 6, 1997 [KR] Rep. of Korea .................... 97-17219

[51] Int. Cl.[6] .......................... H01J 37/20; H01J 37/317
[52] U.S. Cl. ................................ 250/440.11; 250/492.21
[58] Field of Search ................ 250/440.11, 442.11, 250/492.21, 398

[56] References Cited

U.S. PATENT DOCUMENTS

| | | | |
|---|---|---|---|
| 3,993,018 | 11/1976 | Kranik et al. ............................. | 118/52 |
| 4,280,054 | 7/1981 | Guarino .............................. | 250/440.11 |
| 4,412,133 | 10/1983 | Eckes et al. ......................... | 250/442.11 |
| 4,542,298 | 9/1985 | Holden ............................... | 250/440.11 |
| 4,553,069 | 11/1985 | Purser ................................. | 250/442.11 |
| 4,705,951 | 11/1987 | Layman et al. ...................... | 250/442.11 |
| 4,992,660 | 2/1991 | Kobayashi .......................... | 250/440.11 |
| 5,040,484 | 8/1991 | Mears et al. ........................ | 250/442.11 |
| 5,142,154 | 8/1992 | Komagata ........................... | 250/440.11 |
| 5,247,181 | 9/1993 | Oonuki et al. ...................... | 250/440.11 |

*Primary Examiner*—Bruce C. Anderson
*Attorney, Agent, or Firm*—Jones Volentine, LLP

[57] ABSTRACT

A wafer fixing unit of a FIB (Focused Ion Beam) apparatus, for maintaining the flat zone of a wafer in accurate horizontal alignment, includes a fixed frame in a horizontal plane, having a pair of side plates and a forward plate. A first member is composed of a flat rectangular plate in the horizontal plane having a rectangular depression in a forward section, movably disposed between the pair of side plates and rearward of the forward plate. A second member is defined by a T-shape, arranged substantially parallel and above the horizontal plane wherein a narrow end of the T-shape is connected to the first member and the narrow end fits in the rectangular depression. The second member is movably disposed above the forward plate and has a plurality of projecting parts disposed substantially perpendicular to the horizontal plane for contacting and securing a wafer. A pair of springs connect the first member to the forward plate, to allow movement of the first member to form a rest position and a wafer securing position.

9 Claims, 4 Drawing Sheets

WAFER FIXING UNIT FOR FOCUSED ION BEAM APPARATUS

BACKGROUND OF THE INVENTION

1. Field of the Invention

The present invention relates to a wafer holder of a FIB (Focused Ion Beam) apparatus. More particularly, the present invention relates to a wafer fixing unit with vertically projecting parts capable of maintaining the flat zone of a wafer in accurate alignment.

2. Description of the Related Art

In a FIB (Focused Ion Beam) apparatus, a defective portion of a wafer is milled by an accelerated ion beam (e.g., a gallium positive ion beam) directed onto the defective portion. An image is formed from secondary by-products (e.g., secondary electrons, secondary ions, neutrons and so on) emitted from the surface of the defective portion. Such an FIB apparatus is used for analyzing defective portions of layers formed on the wafer as well as a defective portion of the wafer itself. (The defective portions of layers and the defective portion of the wafer are hereinafter referred to as the "sample").

The FIB apparatus operates on portions of the wafer identified by a defect detecting apparatus, such as that manufactured by KLA Corporation. The positions of defects on the wafer are determined by coordinates relative to an origin (0,0) set at a lock point of the defect detection apparatus. A coordinate calibration step is necessary so that FIB coordinates relative to an FIB lock point correspond to the coordinates relative to the lock point of the defect detection apparatus. For an accurate relationship between the coordinates of the FIB lock point and the lock point of the defect detection apparatus, the flat zone of the wafer must be aligned in flush contact with a wafer fixing pin of a wafer fixing unit included in the FIB apparatus.

The structure of a conventional wafer fixing unit and a method for aligning the wafer using the unit are briefly described next.

FIG. 1 is a schematic plan view of a conventional wafer fixing unit of an FIB apparatus, for example, the FIB apparatus manufactured by the MICRION company. As oriented in FIG. 1 and described hereafter, the unit is in the horizontal plane, and the top of FIG. 1 corresponds to a rear area of the unit, while the bottom of FIG. 1 corresponds to a forward area of the unit.

The conventional wafer fixing unit of the FIB apparatus includes a wafer fixing pin 14 having a first plate-shaped support member 10, and a second substantially T-shaped support member 12 that has a narrow base end toward the rear and a wide end toward the forward area. The first support 10 has a semicircular depression with a predetermined depth in a hinge area D into which is fitted the narrow base of the second support 12. A pair of plate-shaped side supports 16, for supporting the wafer fixing pin 14, are fixed on the left and the right of the first support 10 by means of clamp screws A'. A forward plate-shaped support 18 is arranged forward of the first support 10 between the pair of side supports 16. A pair of springs 20 connect the first support 10 to the forward support 18 on either side of the second T-shaped support 12. To the rear of the first support 10 and the pair of side supports 16, a rear support 22 is arranged for supporting the first support and side supports.

The view defined by the section marked II–II' is illustrated in FIG. 2. Referring to FIG. 2, the rear area of the unit is toward the left, and a single projecting part 13 rises vertically, i.e., perpendicularly to the T shaped support 12, at a predetermined height. The vertical surface 13a of the projecting part 13 facing the rear represents the perpendicular surface that contacts the wafer. Referring to FIG. 1, the projecting part 13 (FIG. 2) is formed on the second support 12 so that the rear-facing contact surface 13a falls along the line I–I' where the narrow part of the T-shaped support 12 meets the wide part of the T-shaped support 12. As drawn, the wafer fixing pin 14 is in a rest position when the first support 10 toward the rear of the unit is adjacent to the rear support 22, and the contact surface of the projection part 13 (FIG. 2) is on the line I–I'. When the wafer is aligned using this conventional wafer fixing unit, the flat zone of the horizontal wafer is in contact with the rear surface 13a of the projecting part 13 in FIG. 2, and the flat zone edge is oriented in a direction that is substantially left to right.

The second support 12 is hinged to the first support 10 in hinge area D by means of a clamp screw A so that the wide end of the second support 12 can be rotated left and right through a predetermined range. A pair of grooves B are formed at predetermined positions on the left and right sides, respectively, along the narrow part of the second support 12. At predetermined positions of the forward support 18 on the left and the right of the second support 12, a pair of projecting pegs C are formed, respectively. The pegs are slightly smaller in diameter than the grooves B so that the pegs C can engage the grooves B when the second support 12 is moved forward and rotated left or right. Therefore the pair of projecting parts C and the pair of grooves B are used for locking the wafer fixing pin 14 in a predetermined open position.

Generally, the width (measured left to right) of the wide end of the second support 12, is approximately 19 mm. The width of the contact surface of the projecting part 13 is approximately 6.5 mm.

FIG. 3 is a flow chart showing the four steps of the wafer alignment process using the conventional wafer fixing unit. The wafer fixing pin 14 begins in the rest position. At step S24, the pin 14 is moved forward by an external force. At step S26, either of the grooves B is selected, and the selected groove B is engaged with the corresponding projecting peg C on the forward support 18 by rotating the second member 12 slightly. This locks the wafer fixing pin 14 in an open position, i.e., it fixes the pin. It is possible to fix the wafer fixing pin in an open position because the second support 12 of the pin 14 is hinged in the area D.

At step S28, a wafer is loaded onto the wafer fixing unit. The left to right position of the wafer on the wafer fixing unit is determined by wafer-supporting screws (not shown) located to the rear of the wafer fixing unit. The round edge of the wafer, opposite the flat zone, is supported by the wafer-supporting screws. At this time, the edge of the flat zone of the wafer is oriented along the line III–III' (FIG. 1), which is slightly forward of the line I–I' where the contact surfaces are positioned in the rest position. At step S30, the wafer fixing pin 14 is released from the projecting peg C, and it is moved rearward by the elasticity of the pair of springs 20, pushing the wafer at the same time until the wafer alignment is completed.

However, the wafer alignment using the conventional wafer fixing unit suffers some drawbacks. Referring to FIG. 4, during the fourth step S30, while the flat zone of the wafer 15 is pushed by the projecting part 13 of the second support 12 during its movement rearward, the wafer may be rotated by some amount and the final alignment of the wafer flat zone 15 might be slanted. As a result, the flat zone of the wafer does not come in flush contact with the projecting part 13 of the second support 12 and the alignment of the wafer is not accurate.

In the event that the flat zone 15 of the wafer is not in flush contact with the projecting part 13 of the wafer fixing pin 14, i.e., the wafer is not accurately aligned, and the lock point of the FIB is not at the designated origin (0,0) of the FIB coordinate system. Therefore the coordinate calibration of the FIB apparatus with respect to the defect detection apparatus, such as the KLA, is not accurate. As a result, the actual positions of defects cannot be accurately found in the FIB using the coordinates of the defects from the KLA. This makes the sample defect analysis difficult or impossible.

SUMMARY OF THE INVENTION

Accordingly, it is an object of the present invention to provide a wafer holder structure of a FIB (Focused Ion Beam) apparatus that is capable of accurately aligning a flat zone of a wafer in flush contact with a plurality of projecting parts of a wafer fixing pin of a wafer-fixing unit.

To achieve the above and other objects, the wafer fixing unit for securing a wafer in a focused ion beam apparatus includes a fixed frame in a horizontal plane, having a pair of side plates and a forward plate. A first member is composed of a flat rectangular plate in the horizontal plane having a rectangular depression in a forward section, movably disposed between the pair of side plates and positioned rearward of the forward plate. A second member has a T-shape and is positioned substantially parallel to the horizontal plane. A narrow end of the T-shape is connected to the first member and the narrow end fits in the rectangular depression. The second member is movably disposed above the forward plate and has a plurality of projecting parts disposed substantially perpendicular to the horizontal plane. Each of the plurality of projecting parts has a contact surface substantially perpendicular to the horizontal plane for contacting and securing a wafer. A pair of springs are disposed on opposite sides of the second member between and parallel to the side plates for connecting the first member to the forward plate and for allowing the first member to move to and from a rest position and a wafer securing position.

By designing the plurality of contact surfaces of the plurality of projecting parts of the wafer-fixing unit to be in flush contact with the flat zone of the wafer, it is possible to prevent the wafer from being slanted when the wafer is secured in the FIB apparatus. By also fixing the second member to the first member without a pivot, and by not fixing the pin in an open position during the alignment method, it is further possible to more accurately align the flat zone of the wafer when it is secured in the FIB apparatus.

BRIEF DESCRIPTION OF THE DRAWINGS

The accompanying drawings illustrate the embodiments of the invention, in which.

DETAILED DESCRIPTION OF THE INVENTION

Figure 1:
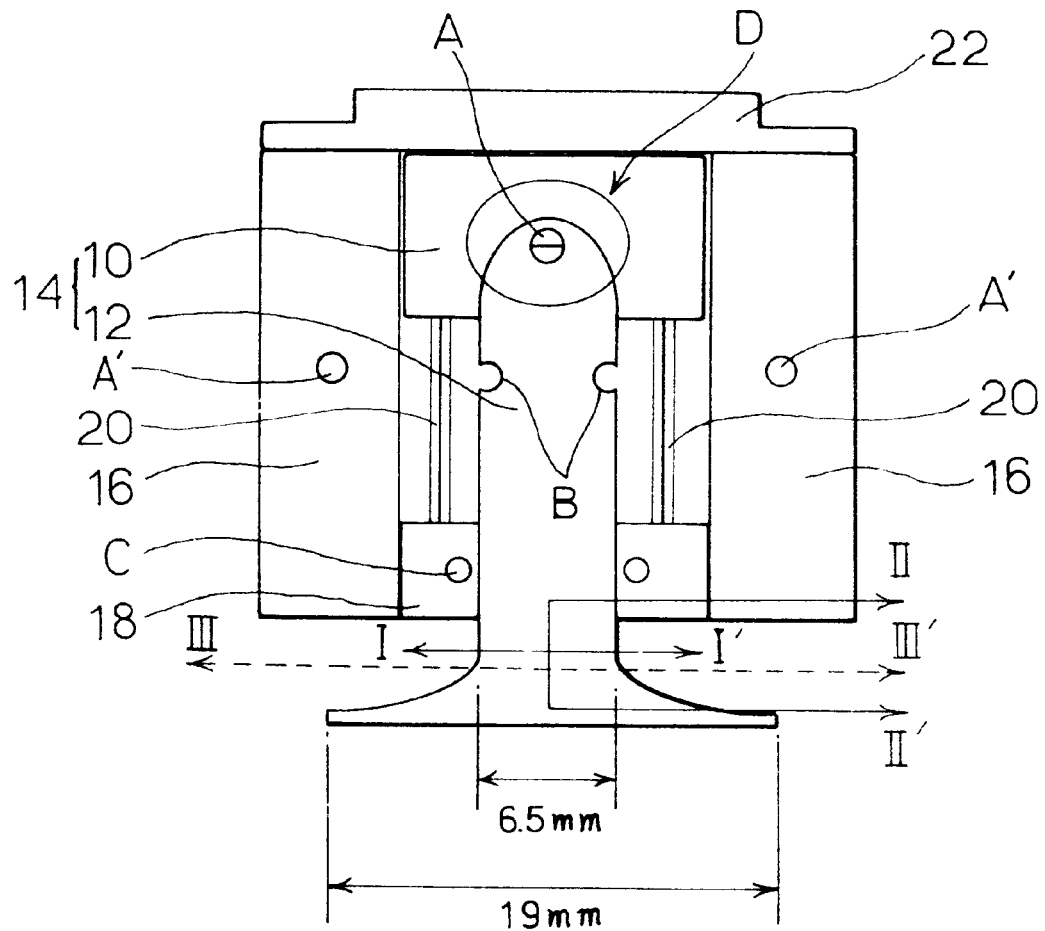
FIG. 1 is a schematic plan view of a wafer fixing unit of a conventional FIB (Focused Ion Beam) apparatus.
Figure 2:
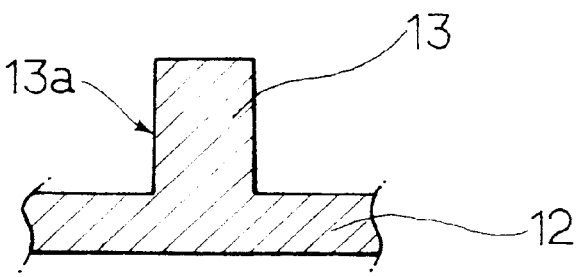
FIG. 2 is a sectional view of a pin of the wafer fixing unit of FIG. 1, taken along line II–II'.
Figure 3:
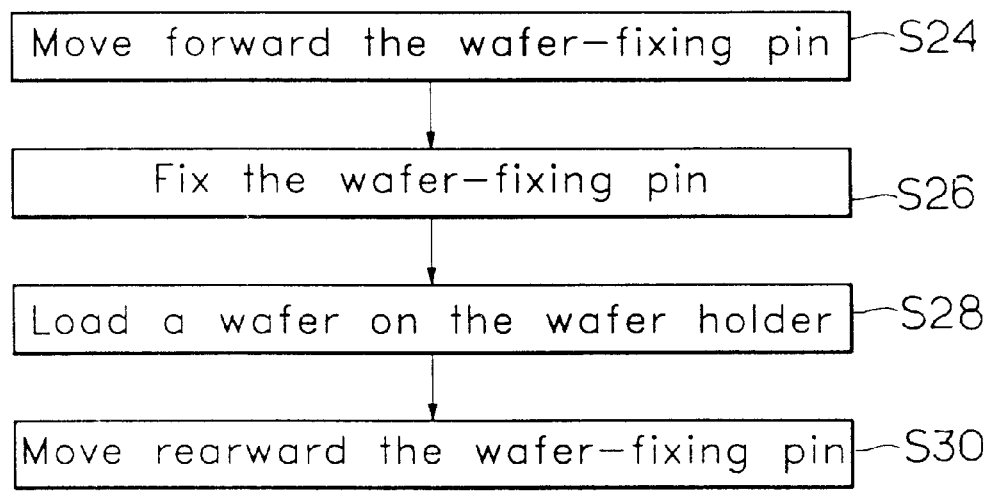
FIG. 3 is a flow chart of a wafer alignment process using the conventional wafer fixing unit of FIG. 1.
Figure 4:
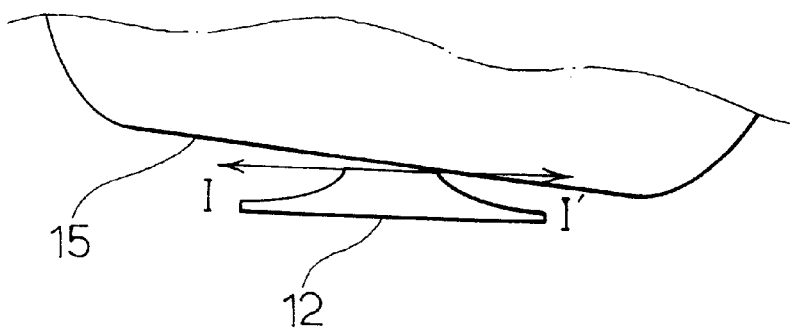
FIG. 4 is a schematic diagram showing the orientation of the flat zone of a wafer relative to a projecting part of the pin in the conventional wafer fixing unit of FIG. 1.
Figure 5:
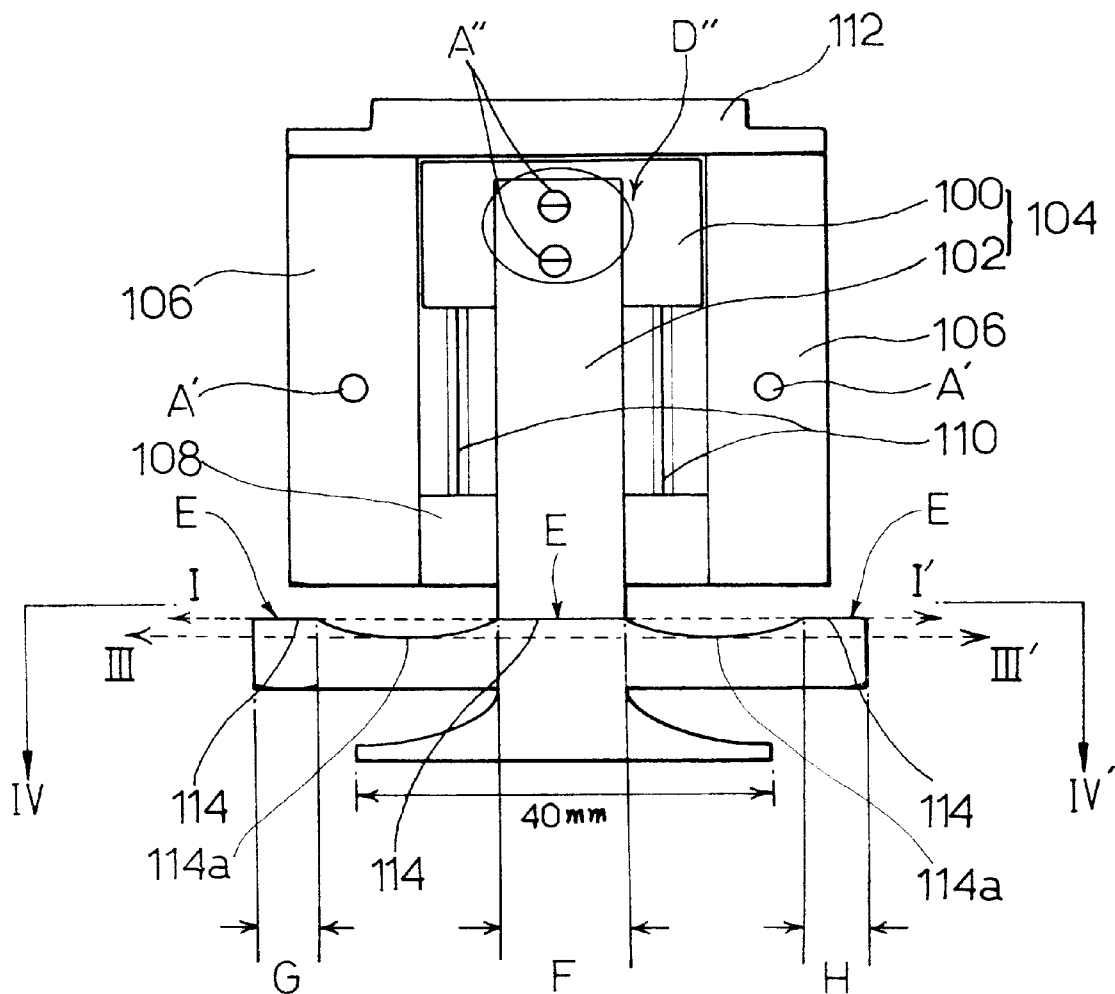
FIG. 5 is a schematic plan view of a wafer fixing unit of an FIB apparatus according to one embodiment of the present invention.

The invention is directed to a wafer fixing unit for securing a wafer in a FIB (focused ion beam) apparatus, and is described with regard to FIG. 5, which is a schematic plan view of the preferred embodiment of the present invention. For discussion purposes, the rear area of the unit is at the top of FIG. 5 and the forward area is at the bottom of FIG. 5.

According to the present invention, a wafer fixing unit of a FIB apparatus has a wafer fixing pin 104 which contacts the flat zone of a wafer at the contact surfaces of a plurality of projecting parts 114, for example, three projecting parts in the preferred embodiment. The wafer fixing pin 104 includes a first supporting member 100 that has a flat rectangular plate shape and has a rectangular depression with a predetermined depth, and a second supporting member 102 which is substantially T-shaped. At the rear of the T-shaped second supporting member 102 is a narrow end which fits into the rectangular depression at the forward portion of the first supporting member 100. The second supporting member 102 has a plurality of projecting parts 114 positioned rearward of, and in close proximity to the wide end of the T-shaped supporting member 102.

The wafer fixing pin 104 is moveable inside a fixed frame. The fixed frame includes a pair of plate-shaped side supporting members 106, which are fixed to the left and the right of the first supporting member 100 by means of clamp screws A'. The frame also includes a forward plate-shaped supporting member 108 disposed forward of the first supporting member 100 between the pair of side supporting members 106. The frame also includes a rear supporting member 112 arranged to the rear of the first supporting member 100 and the pair of side supporting members 106, and connected to the side supporting members 106. A pair of springs 110, one on either side of the second supporting member 102, connect the first supporting member 100 to the forward supporting member 108 of the fixed frame.

Figure 6:
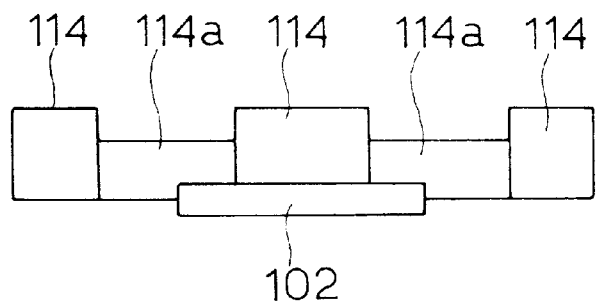
FIG. 6 is a side view of the projecting parts of the wafer fixing unit of FIG. 5, taken along line IV–IV'.

The plurality of projecting parts 114 are positioned between the wide end of the second supporting member 102 and the forward supporting member 108 of the fixed frame. The projecting parts 114 are integral to the second supporting member 102 and are formed at predetermined intervals along line I–I' where the narrow portion of the second supporting member 102 meets the wide end thereof. The projecting parts 114 extend vertically from the second supporting member 102 as shown in the side view taken along the line IV–IV' in FIG. 6. The connecting portions 114a between the projecting parts 114 are preferably lower in height, although they need not be. Referring again to FIG. 5, the wafer is aligned on the wafer fixing unit in such a manner that the flat zone of the wafer is in horizontal contact with the rearward facing contact surfaces E of the plurality of projecting parts 114. The connecting portions 114a are preferably recessed from the rearward facing contact surfaces E as shown in FIG. 5, although they need not be.

The narrow end of the second supporting member 102 is fixed to the first plate-shaped supporting member 100 by means of a plurality of clamp screws A" in a non-hinged region D". As a result, the second supporting member 102 cannot swing left and right as in the conventional unit.

By forming the plurality of projecting parts 114 on the second supporting member 102 when the second supporting member 102 is rigidly fixed to the first member 100 as aforementioned, the flat zone of a wafer comes in contact with a plurality of spaced apart and rigid contact surfaces E so that the wafer is not slanted.

The wide end of the second supporting member 102 has a width in the range from about 38 mm to about 40 mm which is sufficient for supporting the plurality of projecting parts 114. In the preferred embodiment, the width of the wide end of the second T-shaped supporting member 102 is 40 mm. The distance between the outermost projecting parts 114 is preferably greater than the width of the wide end of the second supporting member 102, but less than the width of the flat zone of a wafer.

The widths of the contact surfaces of each of the projecting parts 114 can be the same or they may be different. In the preferred embodiment with three projecting parts 114, the width F of the contact surface of the center projecting part 114 is equal to the sum of the widths G and H of the two outside projecting parts 114.

Figure 7:
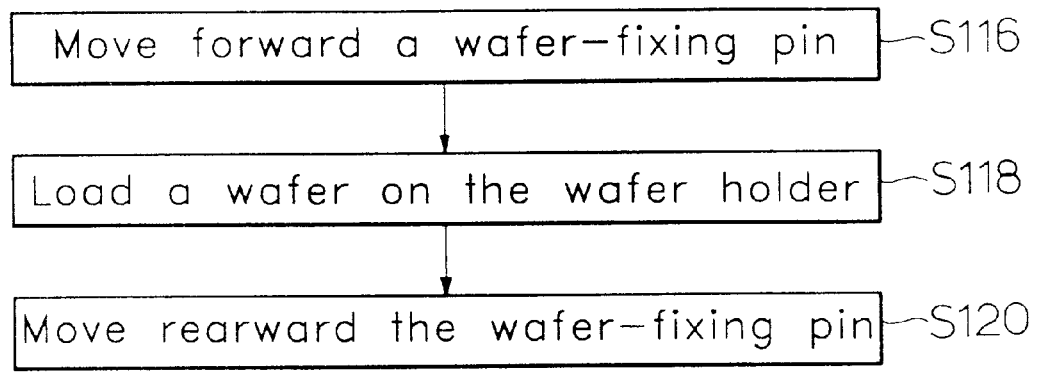
FIG. 7 is a flow chart of a wafer alignment process using the wafer fixing unit of FIG. 5.

Wafer alignment using the wafer fixing unit according to the present invention is carried out through the three steps identified in FIG. 7, which is a flow chart of the wafer alignment using the present wafer fixing unit. Referring to FIG. 5 and FIG. 7, the wafer fixing pin 104 begins in the rest position with the first supporting member 100 against the rear supporting member 112. At step S116, the pin 104 is moved forward by an external force. At step S118, a wafer is installed on the wafer fixing unit to the rear of the projecting parts 114. The left to right position of the wafer on the wafer fixing unit is determined by wafer-supporting screws (not shown) at the rear of the wafer fixing unit, which screws also support the round edge of the wafer opposite the flat zone. At this time, the flat zone of the wafer is located along line III–III' which is slightly forward of the line I–I' which marks the position of the contact surfaces E of the projecting parts 114 when the wafer fixing pin 104 is in a rest position.

At step S120, the wafer fixing pin 104 and the wafer in contact with the projecting parts 114 are moved rearward by the elasticity of the pair of springs 110. This completes the wafer alignment. As a result, the flat zone of the wafer loaded on the wafer fixing unit is in contact with the contact surfaces E of the plurality of projecting parts 114 formed on the wafer fixing pin 104, and the wafer is not slanted.

Figure 8:
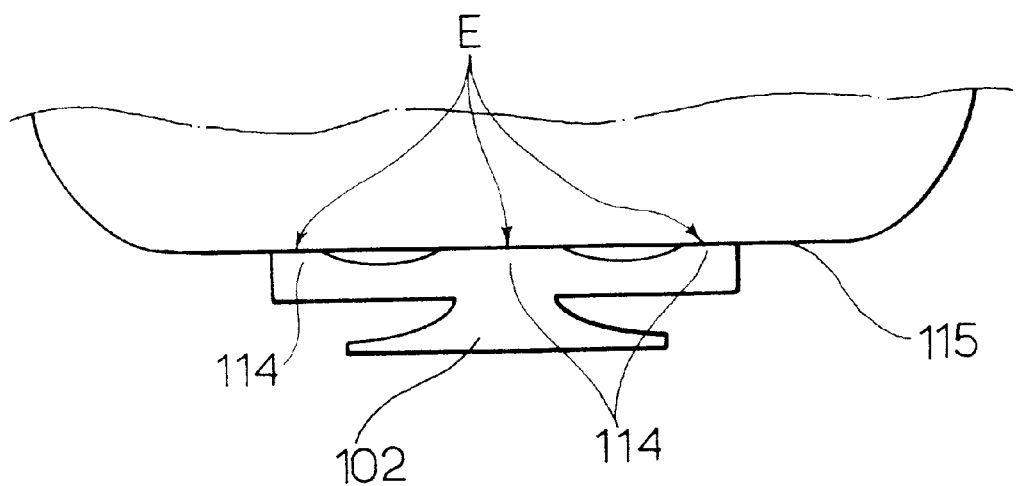
FIG. 8 is a schematic diagram showing the orientation of the flat zone of a wafer relative to a plurality of projecting parts of a wafer fixing pin of the wafer fixing unit of FIG. 5.

FIG. 8 is a schematic diagram showing the state of the flat zone 115 of the wafer relative to the second member 102 of the wafer fixing pin 104 in the preferred embodiment. As shown in FIG. 8, the flat zone 115 of the wafer is in flush contact with the three contact surfaces E of the three projecting parts 114 of the wafer fixing unit, and is not slanted. Therefore, it is possible to maintain the flat zone 115 of the wafer in accurate horizontal alignment.

As a result, the flat zone of the wafer is accurately aligned for the FIB apparatus, and it is possible to accurately determine the position of the lock point origin of the wafer for the FIB apparatus. This results in enhanced reliability for analyzing sample defects using the FIB apparatus.

It will be apparent to those skilled in the art that various modifications and variations can be made in the wafer fixing unit and method of the present invention without departing from the spirit or scope of the invention. Thus, it is intended that the present invention cover the modifications and variations of this invention provided they come within the scope of the appended claims and their equivalents.

What is claimed is:

1. A wafer fixing unit for securing a wafer in a focused ion beam apparatus, comprising:

a fixed frame in a horizontal plane, having a pair of side plates and a forward plate;

a first member disposed rearward of the forward plate in the horizontal plane, having a flat rectangular plate shape and a rectangular depression in a forward section thereof, the first member being movably disposed between the pair of side plates;

a second member having a T-shape defining a narrow end and a wide end, arranged substantially parallel to and above the horizontal plane, wherein the narrow end of the T-shape is placed in the rectangular depression and connected to the first member, the second member being movably disposed above the forward plate, the second member further including a plurality of projecting parts extending substantially perpendicular to the horizontal plane, each of the plurality of projecting parts having a vertical contact surface substantially perpendicular to the horizontal plane for contacting and securing a wafer; and a pair of springs disposed on opposite sides of the second member, between and parallel to the side plates, for connecting the first member to the forward plate and for allowing movement of the first member to and from a rest position and a wafer securing position.

2. The wafer fixing unit of claim 1, wherein respective widths of the vertical contact surfaces are equal.

3. The wafer fixing unit of claim 1, wherein respective widths of the vertical contact surfaces are different.

4. The wafer fixing unit of claim 1, wherein the narrow end of the T-shaped second member is fixed to the rectangular depression of the first member by means of a pair of clamp screws.

5. The wafer fixing unit of claim 1, wherein the wide end of the T-shaped second member has a width in the range from about 38 mm to about 40 mm.

6. The wafer fixing unit of claim 1, wherein the second member has three projecting parts.

7. The wafer fixing unit of claim 6, wherein the three projecting parts are aligned and arranged rearward of, and in close proximity to the wide end of the T-shaped second member.

8. The wafer fixing unit of claim 7, wherein a width of a center vertical contact surface of the three projecting parts is equal to a sum of respective widths of remaining vertical contact surfaces of the three projecting parts.

9. The wafer fixing unit of claim 7, wherein a distance between outermost projecting parts is greater than a width of the wide end of the second member and less than a width of a flat zone of the wafer.

* * * * *